United States Patent
Ishikura

(10) Patent No.: US 8,507,919 B2
(45) Date of Patent: Aug. 13, 2013

(54) FIELD-EFFECT TRANSISTOR

(75) Inventor: Kohji Ishikura, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 145 days.

(21) Appl. No.: 13/071,542

(22) Filed: Mar. 25, 2011

(65) Prior Publication Data
US 2011/0233559 A1    Sep. 29, 2011

(30) Foreign Application Priority Data

Mar. 26, 2010 (JP) ................. 2010-072295

(51) Int. Cl.
*H01L 29/15* (2006.01)
(52) U.S. Cl.
USPC ............. 257/76; 257/416; 257/615; 257/199; 257/194; 257/E29.242; 438/926
(58) Field of Classification Search
USPC ................. 257/76, E29.242, 416, 615, 199, 257/194; 438/926
See application file for complete search history.

(56) References Cited

U.S. PATENT DOCUMENTS

| | | | |
|---|---|---|---|
| 6,580,137 B2* | 6/2003 | Parke | 257/401 |
| 7,265,399 B2 | 9/2007 | Sriram et al. | |
| 2002/0167010 A1* | 11/2002 | Mueller | 257/77 |
| 2010/0084687 A1* | 4/2010 | Chen et al. | 257/194 |

FOREIGN PATENT DOCUMENTS

| | | |
|---|---|---|
| JP | 5-190574 | 7/1993 |
| JP | 2008-518462 | 5/2008 |

* cited by examiner

*Primary Examiner* — Eugene Lee
*Assistant Examiner* — Elias M Ullah
(74) *Attorney, Agent, or Firm* — Young & Thompson

(57) ABSTRACT

A field-effect transistor (FET) in which a gate electrode is located between a source electrode formed on one side of the gate electrode and a drain electrode formed on the other side, a source ohmic contact is formed under the source electrode and a drain ohmic contact is formed under the drain electrode. In the FET, the rise in the channel temperature is suppressed, the parasitic capacitance with a substrate is decreased, and the temperature dependence of drain efficiency is reduced, so that highly efficient operation can be achieved at high temperatures. The drain electrode is divided into a plurality of drain sub-electrodes spaced from each other and an insulating region is formed between the drain ohmic contacts formed under the drain sub-electrodes.

12 Claims, 15 Drawing Sheets

SECOND EMBODIMENT (RELATED ART)

(RELATED ART)

COMPARATIVE EXAMPLE 2

FIELD-EFFECT TRANSISTOR

CROSS-REFERENCE TO RELATED APPLICATIONS

The disclosure of Japanese Patent Application No. 2010-72295 filed on Mar. 26, 2010 including the specification, drawings and abstract is incorporated herein by reference in its entirety.

BACKGROUND

1. Field of the Invention

The present invention relates to field-effect transistors.

2. Description of Related Art

Field-effect transistors (hereafter referred to "FETs") with higher power and higher efficiency are demanded for the amplifiers used in the cellular base-stations, with the advance of telecommunication technology.

To date, Si-MOSFET (Metal-Oxide-Semiconductor FET), GaAs-MESFET (Metal-Semiconductor FET), and GaAs-HJFET (Hetero-Junction FET) have been used as the conventional Power FETs. HJFET is also referred to as HEMT (High Electron Mobility Transistor).

In recent years, "GaN-FET", which uses a wide band gap semiconductor GaN realizing high temperature operation, has been proposed as a high power FET.

GaN substrate for GaN epitaxial growth is difficult to make. Therefore, it is usually grown on the foreign substrates such as sapphire, SiC or Si.

In particular, Si has higher thermal conductivity than sapphire. The large diameter Si substrate is made easier than the SiC substrate, so that it allows the manufacturers to make GaN epitaxial wafers at lower cost. For this reason, in order to encourage the GaN-FETs for consumer devices, it is important to develop a GaN-FET on a Si substrate.

Generally, in order to decrease the substrate parasitic capacitance of a FET for high Radio-frequency (RF) operation, it is desirable to use a semi-insulating substrate. However, Si does not provide a semi-insulating property ($1.0 \times 10^6$ Ωcm or more in resistivity) and only Si substrates with a resistivity of $1.0 \times 10^6$ Ωcm or less are available.

In this specification, "resistivity" refers to the value at room temperature (300 K) unless otherwise specified.

Furthermore, in this specification, "high resistivity" is defined as a resistivity whose value is $1.0 \times 10^2$ Ωcm or more and "low resistivity" is defined as a resistivity whose value is $1.0 \times 10^{-1}$ Ωcm or less.

In order to decrease the substrate parasitic capacitance, it is desirable to use a high-resistivity Si substrate having a resistivity of $1.0 \times 10^2$ Ωcm or more (from $1.0 \times 10^2$ to $1.0 \times 10^6$ Ωcm).

GaN-FETs which use a high-resistivity Si substrate with the value of $1.0 \times 10^4$ Ωcm are reported in two documents: Piner et al., International Electron Devices Meetings (IEDM) 2006. Proceedings, pp. 1-4, "Device Degradation Phenomena in GaN HFET Technology: Status, Mechanisms, and Opportunities" and Martin et al., Compound Semiconductor Integrated Circuit Symposium (CSICS), 2007. Proceedings pp. 1-4, "High-Power and High-Voltage AlGaN/GaN HEMTs-on-Si". FIG. 7 is a schematic sectional view of a semiconductor device with a conventional GaN-FET using a high-resistivity Si substrate as discussed in these documents.

As shown in FIG. 7, in a semiconductor device 101, a plurality of FETs 120, each FET having a source electrode 121S, a drain electrode 122D, and a gate electrode 123G, are formed on a GaN epitaxial wafer 110 in which a GaN epitaxial layer 112 has grown on a high-resistivity Si substrate 111 with the value of $1.0 \times 10^4$ Ωcm and an AlGaN layer 113 has grown on it.

In the semiconductor layer including the GaN layer 112 and AlGaN layer 113, a source ohmic contact 125S is formed under each source electrode 121S and a drain ohmic contact 126D is formed under each drain electrode 122D.

In the semiconductor device 101, a high concentration of two-dimensional electron gas (2DEG) is induced by spontaneous and piezoelectric polarization in hetero interface (channel) between the AlGaN layer and GaN one, producing a higher drain current than conventional Si FETs and GaAs ones. So, the GaN-FET can achieve a high power density operation. The source electrode 121S and the back side of the Si substrate 111 are grounded, and a drain voltage in the range of +10 to +50 V is applied to the drain electrode 122D and a gate voltage is applied to the gate electrode 123G to set a required quiescent current.

Since Si has a narrow band gap, the electrons are easily transferred from the valence band to conduction one while the ambient temperature rises, so an intrinsic current flows at a higher temperature. Therefore, as shown in FIG. 8, Si has a temperature dependence of its resistivity, posing a problem that the substrate becomes less resistive at higher temperatures. The larger the resistivity is at room temperature, the more abruptly the resistivity changes. FIG. 8 is a graph which appears in International Series of Monographs on Semiconductors Volume 9 Silicon Semiconductor Data, p. 51 (authored by Helmut F. Wolf and published by Pergamon Press).

For the above reason, as the temperature rises, the parasitic capacitance between the Si substrate and GaN-FET channel increases and as shown in FIG. 9, the drain efficiency tends to decline. FIG. 9 shows measurement data obtained by the present inventors, representing the relation between channel temperature and drain efficiency in the conventional GaN-FET using the high-resistivity Si substrate as shown in FIG. 7.

Generally, it is ideal that the FET operates without a sudden decline in efficiency over the channel temperature of 200° C. Particularly, GaN-FETs are expected to operate at higher temperatures, taking advantage of the characteristics of the wide band gap semiconductor. FIG. 9 also shows an example of temperature dependence of drain efficiency for ideal GaN-FET operation.

The graph of FIG. 8 suggests that the temperature dependence of the resistivity can be suppressed by the use of a low-resistivity Si substrate with a resistivity of $1.0 \times 10^{-1}$ Ωcm or less, and the decline of the drain efficiency at high temperatures would be also suppressed. However, a low-resistivity Si substrate would generate a parasitic capacitance even at room temperature, leading to a lower efficiency. For this reason, as far as an existing GaN-on-Si wafer is used, the high temperature operation, which is inherent property in GaN as a wide band gap semiconductor, cannot be sufficiently achieved.

FIG. 10 is a plan view of the FET shown in FIG. 1 of Japanese Unexamined Patent Publication No. Hei 5 (1993)-190574. The source electrode S and drain electrode D are shaped like a lattice and the drain electrode area is decreased.

FIGS. 11 and 12 are plan views of the FETs shown in FIGS. 1 and 4 of Japanese Patent Application Publication No. 2008-518462. In the structure shown in FIG. 11, the width of the drain electrode D is smaller than the width of the source electrode S. In the structure shown in FIG. 12, the drain electrode D is divided into at least two sub-electrodes.

In FIGS. 10 to 12, symbols S, D, and G denote source electrode, drain electrode, and gate electrode respectively.

SUMMARY

Generally, in order to amplify the RF power efficiently, the amplified power should be put out without power loss. If the substrate is semi-insulating or has a high resistivity, the FET puts out the amplified power efficiently; on the other hand, if the resistivity of the substrate is less than $1.0 \times 10^2$ Ωcm, part of the amplified power will go into the substrate and turn into heat. Even if the GaN layer between the substrate and channel has a high resistivity, part of the RF power will go into the substrate as far as there is a capacitance between the drain electrode and substrate.

In addition, if the FET is designed to amplify high power, a huge amount of heat is generated in the channel, so in order to decrease the thermal resistivity for the purpose of decreasing the channel temperature, it is desirable to widen the gate pitch (spacing between the gate electrodes of neighboring FETs). If the gate pitch is thus widened, the drain electrode width and source electrode width should also be increased. If the substrate is semi-insulating or has a high resistivity, there is no problem about the increased drain electrode width, but if the substrate has a low resistivity, the larger the drain electrode width is, the larger the parasitic capacitance between the drain electrode and substrate is and the lower the efficiency is.

In the FET shown in FIG. 10 as described in Japanese Unexamined Patent Publication No. Hei 5 (1993)-190574, the drain electrode is shaped like a lattice in order to decrease the drain electrode area and thereby decrease the parasitic capacitance with the substrate. In the FETs as described in Patent Application Publication No. 2008-518462, in order to decrease the parasitic capacitance, the drain electrode width is decreased as shown in FIG. 11, or the drain electrode is divided into at least two sub-electrodes as shown in FIG. 12.

However, in the case of the FET shown in FIG. 10 as described in Japanese Unexamined Patent Publication No. Hei 5 (1993)-190574, the drain electrode area is decreased to some extent, but generation of a parasitic capacitance in the lattice-shaped drain electrode cannot be avoided and the efficiency improvement is limited. Above all, since the conductive layer lies even in the open areas of the lattice under the drain electrode, the drain electrode area with respect to the substrate practically remains unchanged, so the parasitic capacitance cannot be decreased practically. Particularly, in the case of a GaN-FET which generates a high concentration of two-dimensional electron gas, the influence of the parasitic capacitance between the channel under the drain electrode and the substrate is significant and it seems that a sufficient improvement cannot be achieved simply by decreasing the drain electrode area.

For the same reason, even when the drain electrode is divided to make the drain electrode area smaller as shown in FIG. 12, the parasitic capacitance is not decreased effectively.

In the structure shown in FIG. 11 as described in Patent Application Publication No. 2008-518462, the area of the drain electrode and the area of the conductive layer under it are decreased practically so that the parasitic capacitance can be decreased effectively. FIG. 11 also illustrates the "drain side gate pitch" GP(D) and "source side gate pitch" GP(S). GP(D) stands for the distance between two neighboring gate electrodes divided by a drain electrode, and GP(s) stands for the distance between two neighboring gate electrodes divided by a source electrode. The structure shown in FIG. 11 is supposed to keep the thermal resistivity constant and suppress the rise of the channel temperature by increasing the source electrode width instead of decreasing the drain electrode width. That is, if the average gate pitch between GP (D) and GP(S) is constant, the average thermal resistivity also remains constant regardless of the drain electrode width. But actually a local rise in the channel temperature cannot be avoided because the channel temperature of two neighboring FETs with a narrow drain electrode between them would be much higher than the average channel temperature of the whole device. Particularly in the case of a device featuring a high power density, such as a GaN-FET, the spacing between two neighboring FETs must be wide enough because each FET generates a large amount of heat.

According to one aspect of the present invention, there is provided a field-effect transistor (FET) in which a gate electrode is located between a source electrode formed on one side of the gate electrode and a drain electrode formed on the other side, a source ohmic contact is formed under the source electrode and a drain ohmic contact is formed under the drain electrode. Here, the drain electrode is divided into a plurality of drain sub-electrodes spaced from each other and an insulating region is formed between the drain ohmic contacts formed under the drain sub-electrodes.

According to the invention, a FET can provide a gate pitch large enough to prevent the rise in the channel temperature between neighboring FETs formed on a substrate.

In the FET according to the present invention, the drain electrode is divided into a plurality of drain sub-electrodes and the drain ohmic contacts formed under the drain sub-electrodes are insulated from each other, so the drain area and the area of the conductive layer under it are small, thereby decreasing the parasitic capacitance with the substrate effectively. Therefore, even when the gate pitch is increased in order to decrease the thermal resistivity, the parasitic capacitance with the substrate is suppressed effectively because the area of the drain electrode and the area of the conductive layer under it are small. Furthermore, even when the resistivity of the substrate changes with the rise in the channel temperature, the increase in the parasitic capacitance with the substrate is suppressed, thereby reducing the temperature dependence of drain efficiency and permitting highly efficient operation at high temperatures.

According to the present invention, a GaN wafer which uses a low-cost Si substrate can be employed, so cost reduction can be achieved.

According to the present invention, it is possible to provide a field-effect transistor (FET) in which the rise in the channel temperature is suppressed, the parasitic capacitance with the substrate is decreased, and the temperature dependence of drain efficiency is reduced, thereby permitting highly efficient operation at high temperatures

BRIEF DESCRIPTION OF THE DRAWINGS

Note: In FIGS. 1, 2, 5, 7, 11, 12, and 14, GP(D) designates a drain side gate pitch that means a distance between two neighboring gate electrodes divided by a drain electrode, and GP(S) designates a source side gate pitch that means a distance between two neighboring gate electrodes divided by a source electrode.

DETAILED DESCRIPTION

First Embodiment

Figure 1:
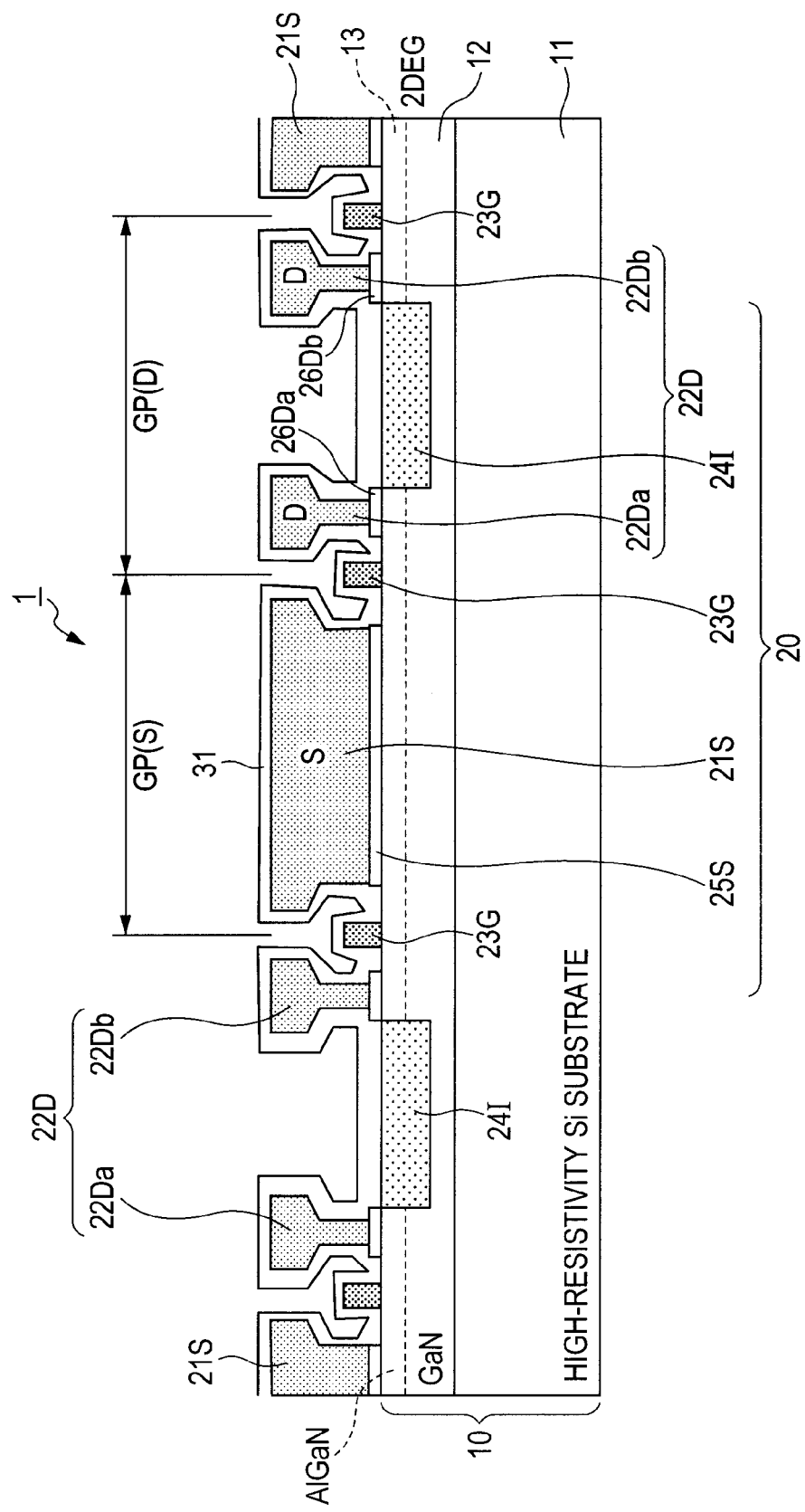
FIG. 1 is a schematic sectional view of a semiconductor device with a field-effect transistor (FET) according to a first embodiment of the invention.
Figure 2:
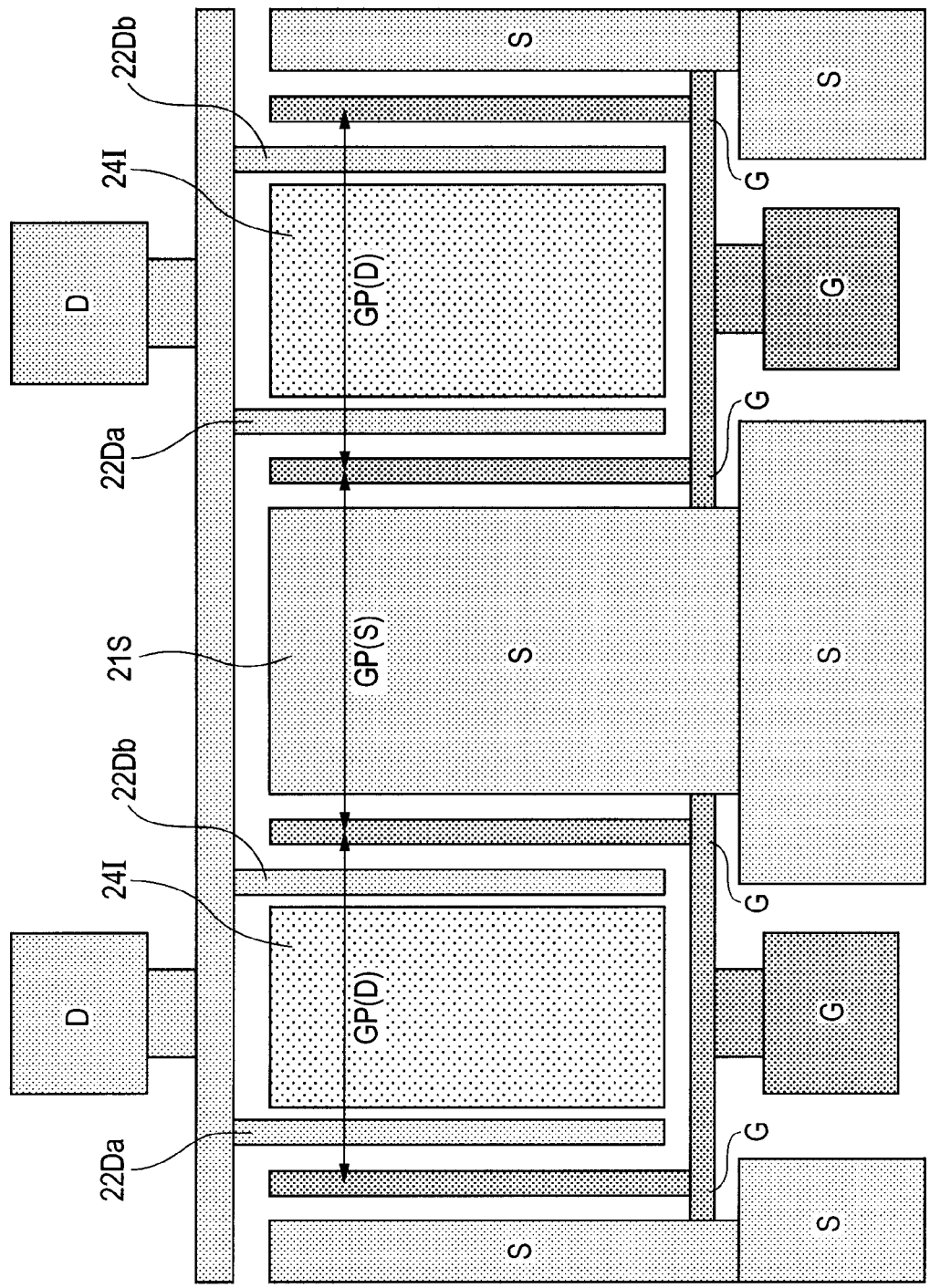
FIG. 2 is a plan view of an essential part of the semiconductor device shown in FIG. 1.

Next, the structure of a semiconductor device with a field-effect transistor (FET) according to a first embodiment of the present invention will be described referring to the accompanying drawings. FIG. 1 is a schematic sectional view of the semiconductor device according to this embodiment and FIG. 2 is a plan view of an essential part of the device. For easy understanding, the scales and positions of the elements shown in the figures are different from their actual scales and positions. In the sectional view, hatching is omitted as appropriate.

As shown in FIGS. 1 and 2, the semiconductor device 1 according to this embodiment is structured as follows: a plurality of FETs 20, each FET having a source electrode 21S, a drain electrode 22D, and a gate electrode 23G, are formed on a GaN epitaxial wafer 10 in which a GaN epitaxial layer 12 has grown over a high-resistivity Si substrate 11 with a resistivity value of $1.0 \times 10^2$ Ωcm or more and an AlGaN layer 13 has grown on it.

The source electrode 21S, drain electrode 22D, and gate electrode 23G are insulated from each other by an insulating film (protective film) 31.

Figure 8:
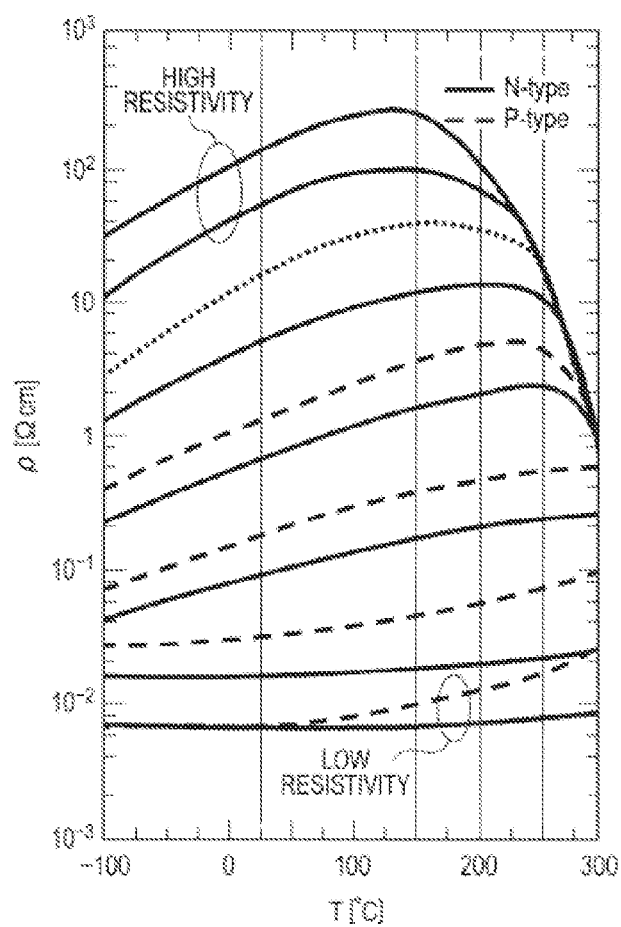
FIG. 8 is a graph showing the temperature dependence of the resistivity of a Si substrate.
Figure 9:
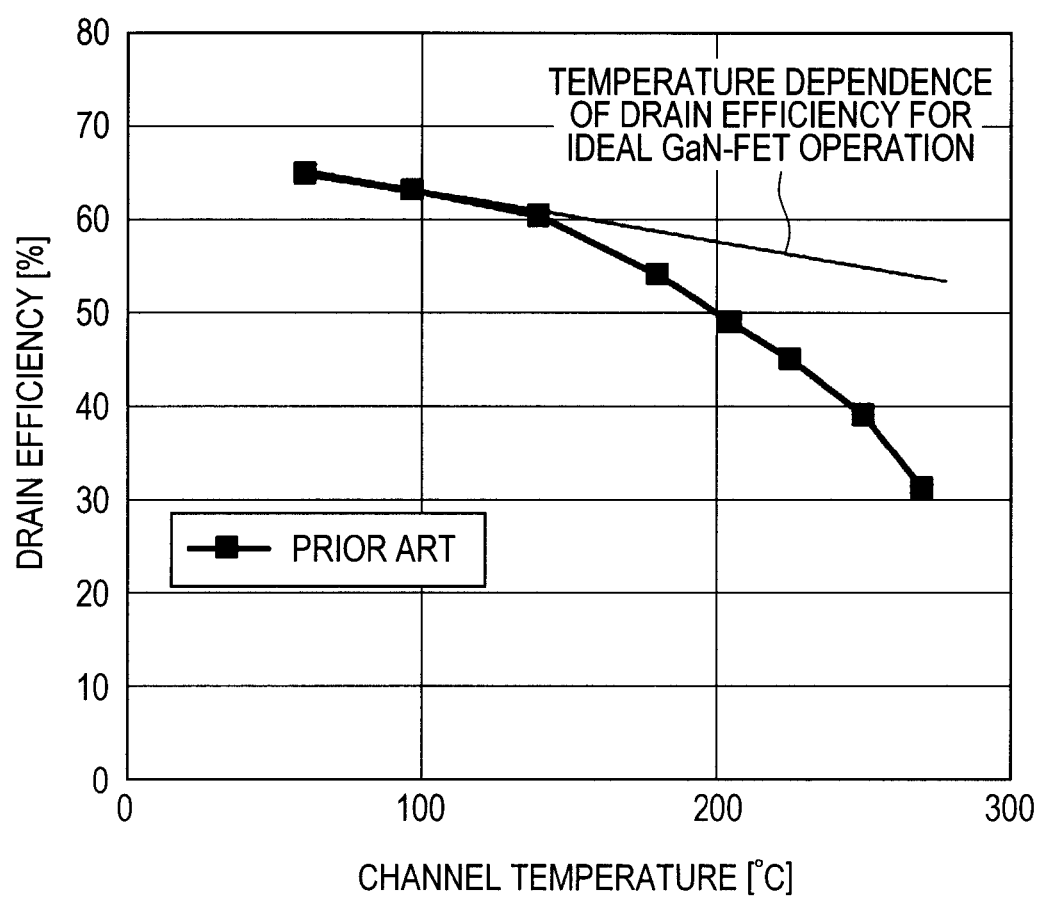
FIG. 9 is a graph showing the temperature dependence of the drain efficiency of a GaN-FET on a conventional high-resistivity Si substrate.
Figure 10:
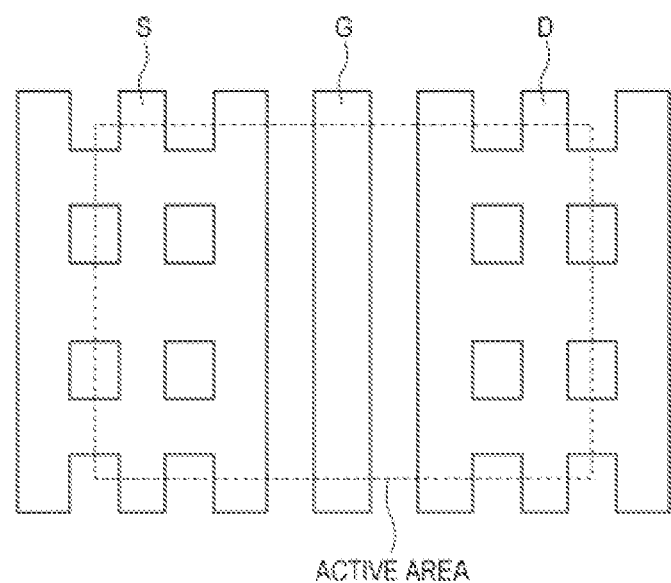
FIG. 10 is a plan view of the FET as described in Japanese Unexamined Patent Publication No. Hei 5 (1993)-190574.
Figure 11:
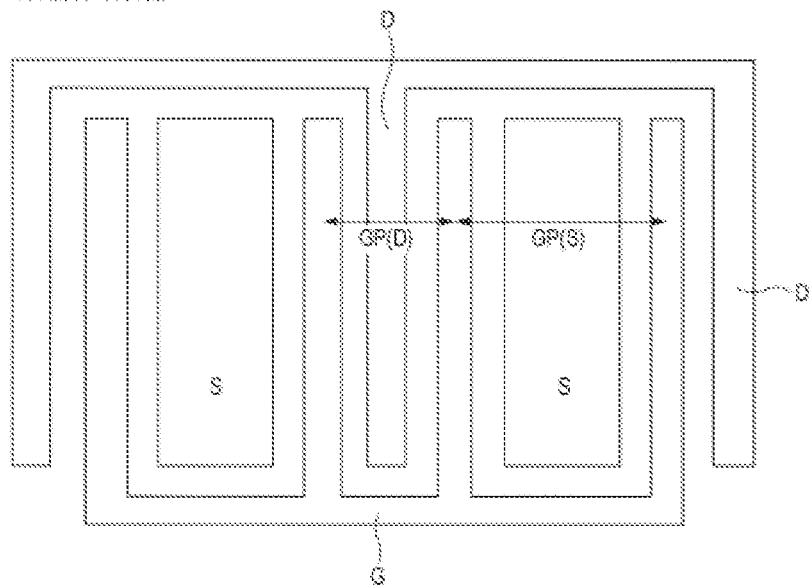
FIG. 11 is a plan view of a FET as described in Patent Application Publication No. 2008-518462.
Figure 12:
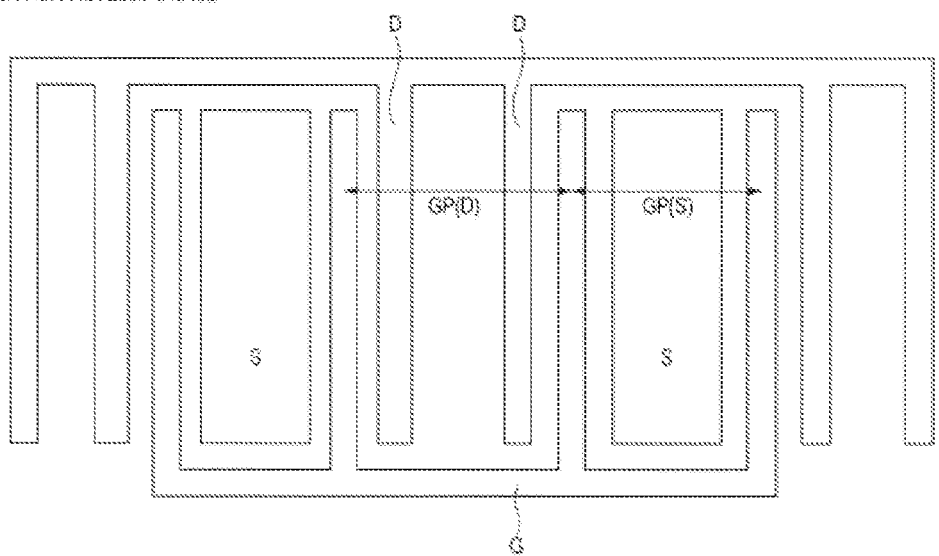
FIG. 12 is a plan view of another FET as described in Patent Application Publication No. 2008-518462.

In this embodiment, the substrate 11 is a p-type high-resistivity Si substrate with a resistivity of $2.0 \times 10^3$ Ωcm at room temperature. Alternatively the substrate 11 may be of n type. When the resistivity of the substrate 11 is higher, the parasitic capacitance is smaller; however, as shown in FIG. 8, when the Si substrate's resistivity at room temperature is higher, its resistivity changes more abruptly at high temperatures.

In the semiconductor device 101, a high concentration of two-dimensional electron gas (2DEG) is induced by spontaneous and piezoelectric polarization in hetero interface (channel) between the AlGaN layer 13 and GaN layer 12, producing a higher drain current than in conventional Si devices and GaAs devices. This permits amplification with a high power density.

In this embodiment, the drain electrode 22D is divided into two drain sub-electrodes 22Da and 22Db.

In this embodiment, in the semiconductor layer including the GaN layer 12 and AlGaN layer 13, a source ohmic contact 25S is formed under the source electrode 21S and drain ohmic contacts 26Da and 26Db are formed under the drain sub-electrodes 22Da and 22Db. In addition, an insulating region 24I is formed between the drain ohmic contacts 26Da and 26Db formed under the drain sub-electrodes 22Da and 22Db respectively.

The number of sub-electrodes into which the drain electrode 22D is divided is not limited to 2 but may be 3 or more.

From the purpose of decreasing the parasitic capacitance, it is desirable that the width of each of the drain sub-electrodes (22Da and 22Db) be as small as possible. However, if it is too small, electrode degradation due to electromigration, etc may occur.

In this embodiment, the FET 1 as a multi-finger FET chip is designed so that when gate width Wg is 24 mm, finger length (drain electrode length) Wu is 400 µm, and the number of fingers Nf is 60, a maximum total current of 2 A flows therein, so the current per a drain electrode is calculated to be 0.033 A. The drain electrode sectional area (S) is calculated from the drain electrode thickness (t) and drain electrode width (B) (S=B×t), then the maximum current density per drain electrode is calculated from the calculated sectional area. The minimum drain electrode width B can be calculated on the assumption that the upper limit is $3 \times 10^5$ A/cm² as the current density at which electromigration begins. In this embodiment, assuming that t is 3 µm, the minimum width of each of the drain sub-electrodes (22Da and 22Db) is calculated to be 3.7 µm (=B).

As discussed above, the minimum drain electrode width B depends on the number of fingers of the FET and the number of drain sub-electrodes of the FET, size, preset maximum current, drain electrode thickness and so on and it is a matter of design choice for each device type. By coupling an interconnect wire over the drain electrodes using an air bridge process, etc, the drain electrode width B can be further decreased. In this embodiment, the drain electrode thickness is 3 µm and the drain electrode width is 5 µm.

The insulating region 24I extends from the surface of the AlGaN layer 13 to the upper side of the GaN layer 12. In the insulating region 24I, the crystals of the AlGaN layer 13 and GaN layer 12 are destroyed and no two-dimensional electron gas exists.

In this embodiment, the size of one insulating region 24I between two drain sub-electrodes 22Da and 22Db is 400 µm in length and 60 µm in width.

The method for forming the insulating region 24I is not limited. In this embodiment, ion implantation with a nitrogen ion source is adopted.

The insulating region 24I is formed by covering the non-active area with photo resist and implanting ions into an opening. Ion implantation is made twice, in which the energy for the first implantation process is 50 keV and that for the second implantation process is 200 KeV and the dose is $1.0 \times 10^{14}$ cm$^{-2}$ for each process. As a consequence, the crystal from the surface of the AlGaN layer 13 up to around 300 nm is destroyed and two-dimensional gas completely disappears.

Since the required implantation energy, dose and the depth of the insulating region 24I depend on the ion source in use and the epitaxial layer structure, they are matters of design choice for each device type.

H, He, Zn, B, and O may also be used for an ion source in ion implantation.

The method for forming the insulating region 24I is not limited to ion implantation but any other method may be adopted as far as it lets two-dimensional electron gas between the drain sub-electrodes 22Da and 22Db disappear and ensures a sufficient insulating property. The insulating region 241 may be prepared by removing an active area by dry etching or forming an active area except the area to be the insulating region 241 by crystal re-growth.

In this embodiment, the spacing between two neighboring FETs 20 is wide enough. As for the gate pitch for the gate electrodes 23G as an inter-gate spacing, although it is preferable that the drain side gate pitch and the source side gate pitch be equal, it is acceptable that they are not equal when the degree of inequality is within a permissible range from the viewpoint of thermal design. The average of the drain side gate pitch and source side gate pitch need not be constant and the average gate pitch may be larger in the center of the chip where the channel temperature of the FET 20 tends to rise and the average gate pitch may be smaller in the chip edge area.

Figure 3:
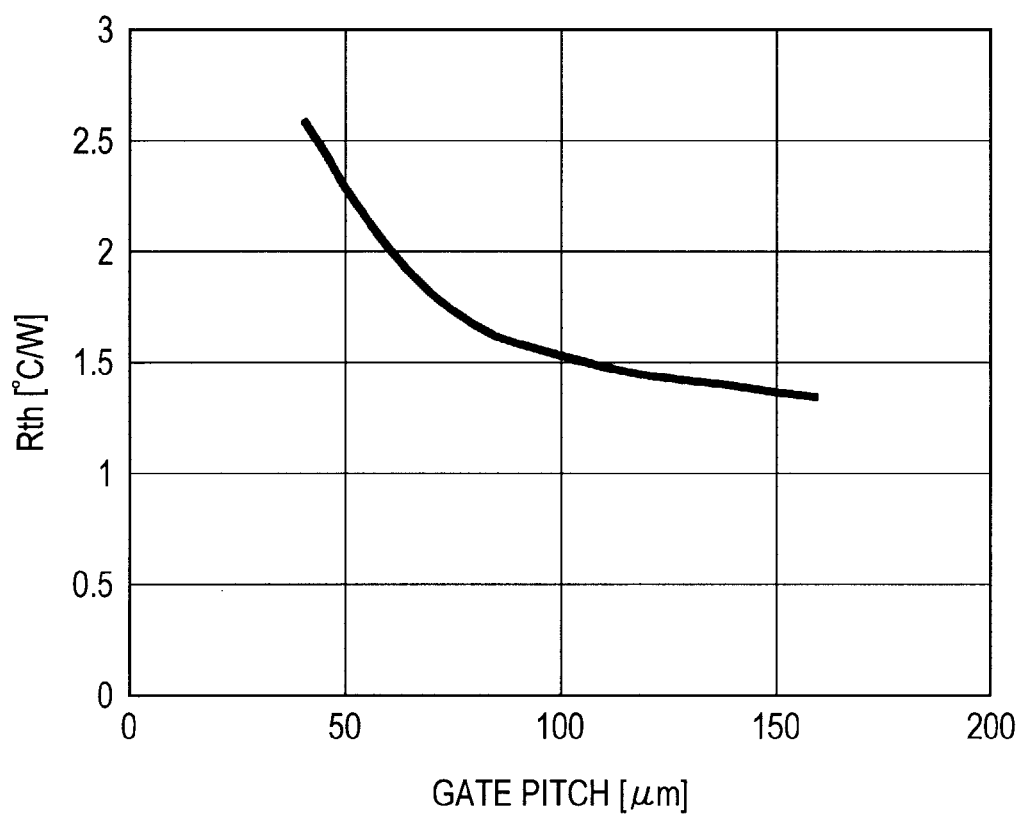
FIG. 3 is a graph which shows the relation between gate pitch (=distance between neighboring two electrodes) and thermal resistivity.

FIG. 3 is a graph which shows the relation between gate pitch and thermal resistance Rth as obtained by calculation. In the calculation, it was assumed that the drain side gate pitch is equal to the source side gate pitch. The graph indicates that when the gate pitch is larger, the thermal resistance is smaller but the thermal resistance is less dependent on the gate pitch when the gate pitch is above 80 μm. This is because at a gate pitch of above 80 μm, the distance from a heat source is large enough to cause the heat from each FET 20 to spread without thermal interference between FETs 20. Therefore, inequality between the drain side gate pitch and source side gate pitch has no problem when the smaller gate pitch is larger than a gate pitch at which the thermal resistance declining rate begins to slow down, whichever is smaller between the drain side gate pitch and source side gate pitch.

The gate pitch at which the thermal resistance declining rate begins to slow down depends on the semiconductor or package thickness and the heat conductivity of its material and is a matter of design choice for each device type.

When the gate pitch is small, in order to make thermal interference between neighboring FETs 20 uniform, it is desirable that the drain side gate pitch be equal to the source side gate pitch. However, from the viewpoint of thermal design, if the thermal resistance of the FET 20 is within the permissible range, it is acceptable that the drain and source side gate pitches are not equal. In this embodiment, the drain and source side gate pitches are equal at 80 μm.

The present inventors conducted a test to evaluate the parameter versus temperature characteristics of a unit cell FET with gate width Wg of 2.4 mm (Wu=400 μm, Nf=6) according to this embodiment and have found that the parasitic capacitance between the drain electrode and substrate, Cds, is 2.3 pF.

Figure 7:
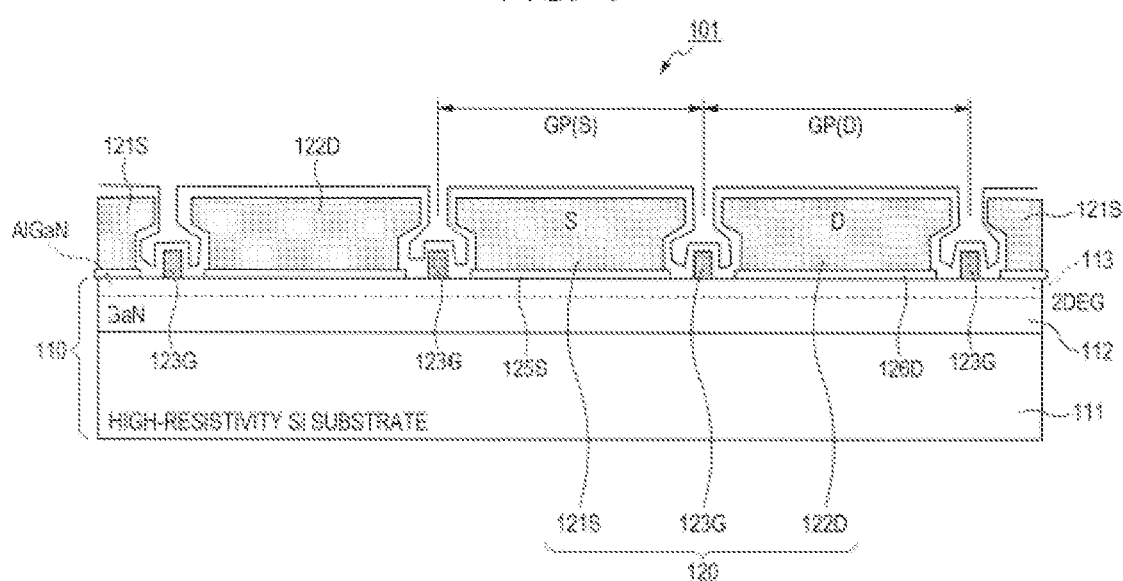
FIG. 7 is a schematic sectional view of a semiconductor device with a GaN-FET on a conventional high-resistivity Si substrate as discussed in the aforementioned documents "Device Degradation Phenomena in GaN HFET Technology: Status, Mechanisms, and Opportunities" by Piner et al. and "High-Power and High-Voltage AlGaN/GaN HEMTs-on-Si" by Martin et al.

On the other hand, in the case of the conventional FET shown in FIG. 7 (which is the same in design parameters including the drain gate pitch as in this embodiment except that the drain electrode is not divided), CdS has been found to be 3.8 pF. Also, in the case of the FET shown in FIG. 13 as comparative example 1 in which the drain electrode is divided in the same manner as in this embodiment but there is no insulating region between the drain ohmic contacts formed under the drain sub-electrodes (which is the same in design as in this embodiment except the absence of an insulating region), CdS has been found to be 3.6 pF, suggesting that the effect in remedying the parasitic capacitance problem is small.

Parasitic capacitance is a capacitance which is generated between two-dimensional gas and a substrate and even if the drain electrode area is small, a parasitic capacitance is generated in the presence of two-dimensional gas between drain sub-electrodes. This phenomenon is particularly remarkable in a FET which generates a high concentration of electrons, such as GaN-FET. In any type of FET, if an area with a high concentration of electrons which functions as a channel exists between two drain sub-electrodes, a parasitic capacitance is generated with the substrate, so it is apparent that the parasitic capacitance can be decreased by isolation of that area.

Figure 14:
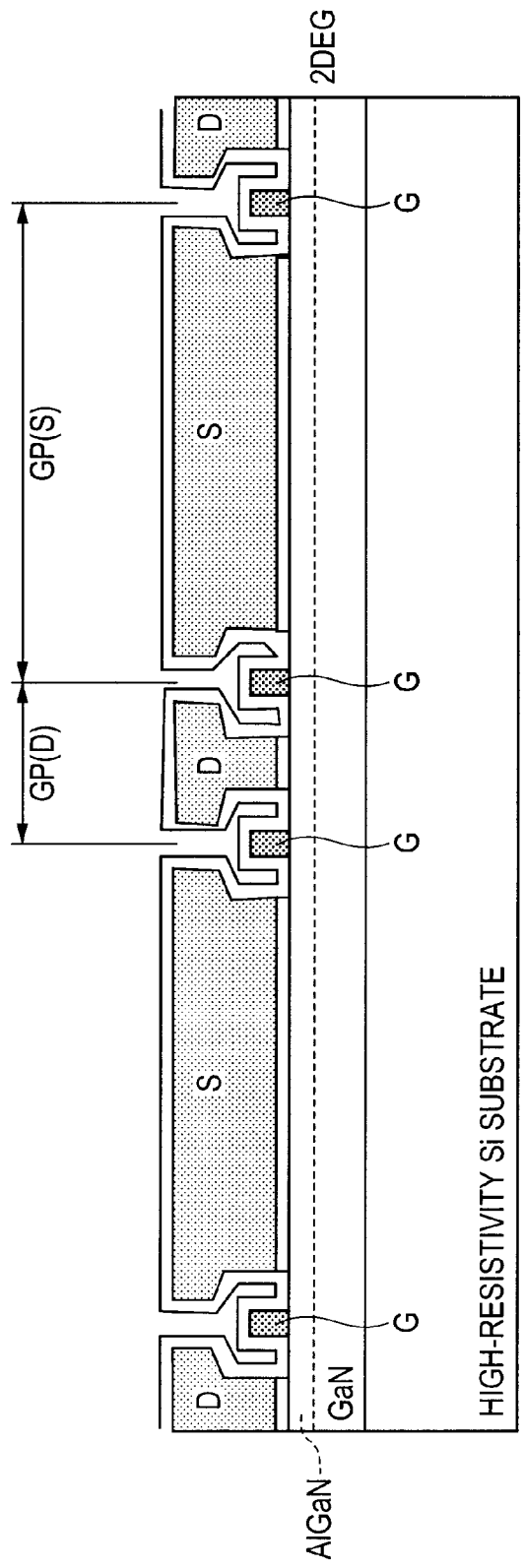
FIG. 14 is a schematic sectional view of a semiconductor device with a FET as comparative example 2.

In the FET shown in FIG. 14 as comparative example 2, the drain electrode is not divided and the width of the drain electrode is decreased. Here, gate width Wg is 24 mm, finger length Wu is 400 μm, and the average of the drain and source side gate pitches is 80 μm. The drain side gate pitch is 20 μm and the source side gate pitch is 140 μm. From the test it has been found that while the thermal resistance is 1.9° C./W in this FET, it is 1.7° C./W in the FET 20 according to the first embodiment in which the gate pitches are equal. In other words, the FET shown in FIG. 14, which has a very small drain electrode width and has the same average gate pitch as the FET 20, provides a higher thermal resistance.

The above test result arises because the heat from two neighboring FETs with a narrow drain electrode between them causes thermal interference and results in a significant rise in the channel temperature. Due to thermal conductivity versus temperature characteristics of semiconductor, the higher the channel temperature, the lower the thermal conductivity and thus the higher the overall thermal resistance. As explained above, even when the average of the drain side gate pitch and source side gate pitch is large, inequality between the drain side gate pitch and source side gate pitch may affect the thermal resistance and it seems difficult to decrease the parasitic capacitance simply by decreasing the drain electrode width. Therefore, whichever smaller is between the drain side and source side gate pitches should be designed to be at least larger than the gate pitch at which the thermal resistance declining rate begins to slow down. However, the drain and source side gate pitches can be unequal when the degree of inequality is within the permissible range from the viewpoint of thermal design.

Figure 13:
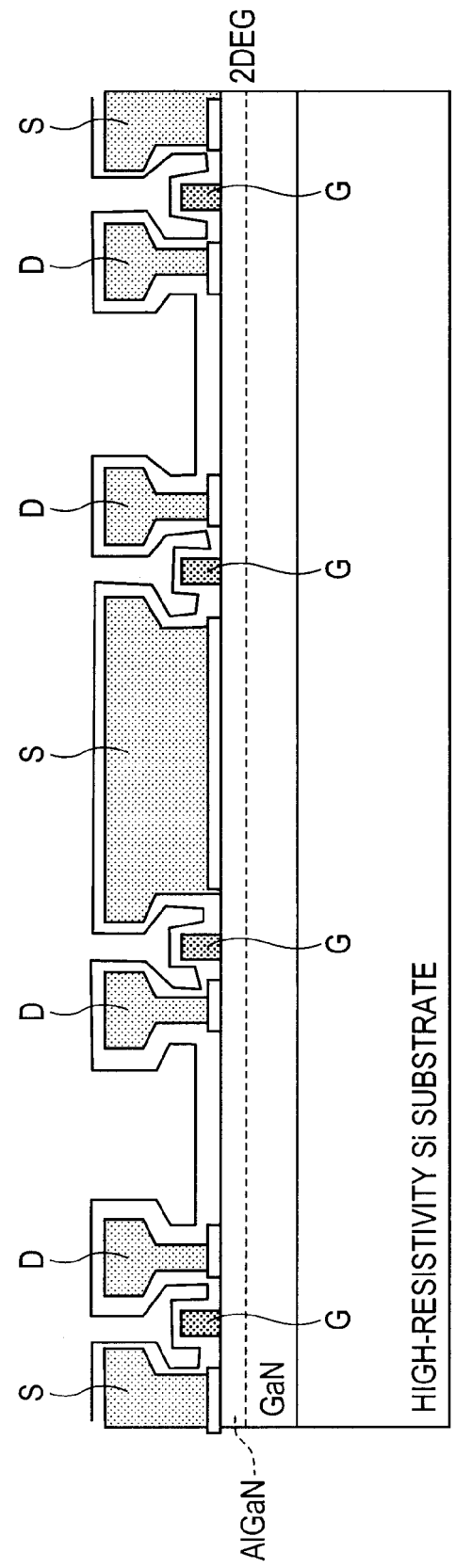
FIG. 13 is a schematic sectional view of a semiconductor device with a FET as comparative example 1.

In FIGS. 7, 13, and 14, symbols S, D, and G denote source electrode, drain electrode, and gate electrode, respectively.

Figure 4:
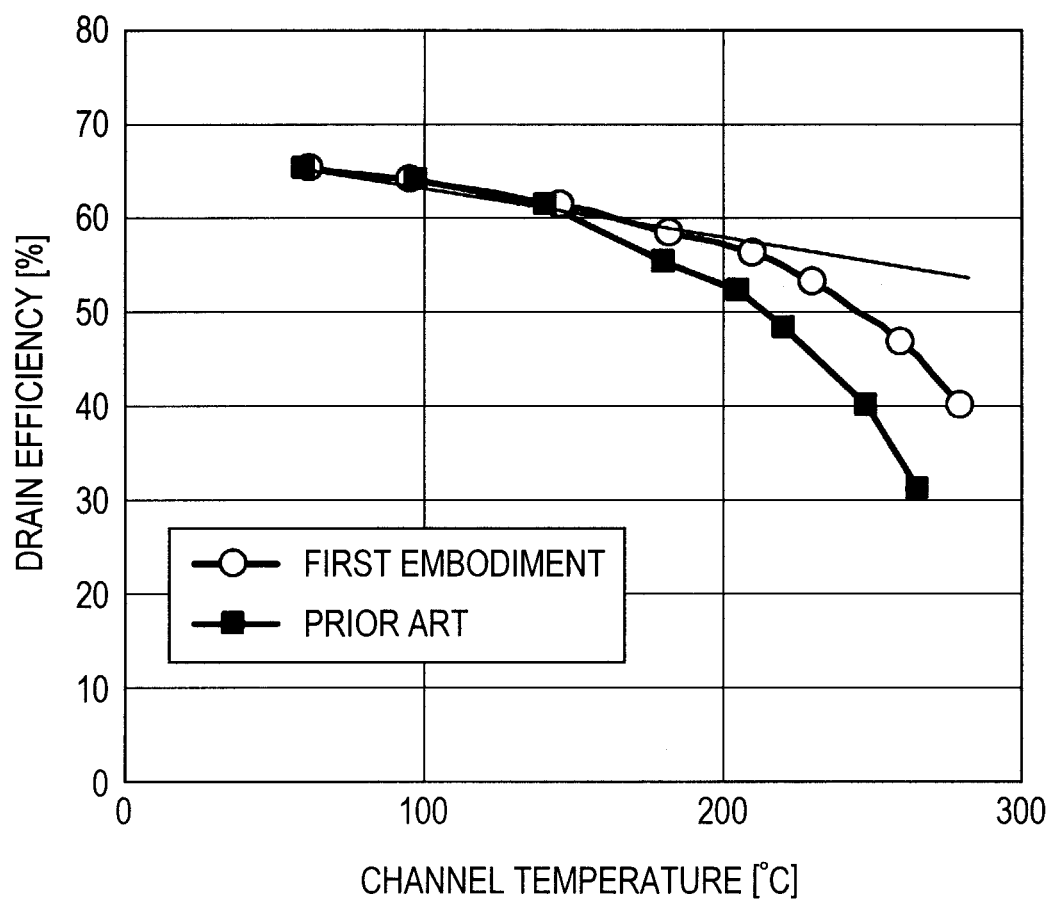
FIG. 4 is a graph which shows drain efficiency versus temperature characteristics in the first embodiment and an example of prior art.

FIG. 4 shows drain efficiency versus temperature characteristics of the GaN-FET according to this embodiment. Here, gate width Wg is 2.4 mm. In RF measurement, the frequency is 2 GHz and the drain voltage is 50 V. FIG. 4 shows data on the conventional FET (prior art) shown in FIG. 7 as well as data on this embodiment.

While in the conventional FET shown in FIG. 7 the efficiency significantly declines with the increase in the parasitic capacitance at a channel temperature of 150° C. or more, in the FET 20 according to this embodiment the efficiency declines more gradually and high efficiency is maintained at 200° C. The reason is that even when the resistivity of the substrate changes with the rise in temperature, the increase in the parasitic capacitance is suppressed because the drain electrode is divided into narrow drain sub-electrodes and the drain ohmic contacts formed under the narrow drain sub-electrodes are insulated from each other. Thus, according to the present invention, highly efficient operation at high temperatures can be achieved with a GaN wafer which uses a low-cost Si substrate.

As explained so far, the semiconductor device 1 according to this embodiment provides a gate pitch large enough to prevent the channel temperature between neighboring FETs 20 formed on the same wafer 10 from going up.

In the semiconductor device 1 according to this embodiment, the drain electrode 22D is divided into a plurality of drain sub-electrodes (22Da and 22Db) and the drain ohmic contacts 26Da and 26Db formed under the drain sub-electrodes 22Da and 22Db are insulated from each other, so the drain area and the area of the conductive layer under it can be small, thereby decreasing the parasitic capacitance with the substrate 11 effectively. Therefore, even when the gate pitch is increased in order to decrease the thermal resistance, the parasitic capacitance with the substrate can be decreased effectively because the drain electrode area and the area of the conductive layer under it are small. Furthermore, even when the resistivity of the substrate 11 changes with the rise in the channel temperature, since the increase in the parasitic capacitance with the substrate 11 is suppressed and the temperature dependence of drain efficiency is reduced, thereby permitting highly efficient operation at high temperatures.

According to this embodiment, a GaN wafer which uses a low-cost Si substrate can be employed so that cost reduction can be achieved.

Second Embodiment

Figure 5:
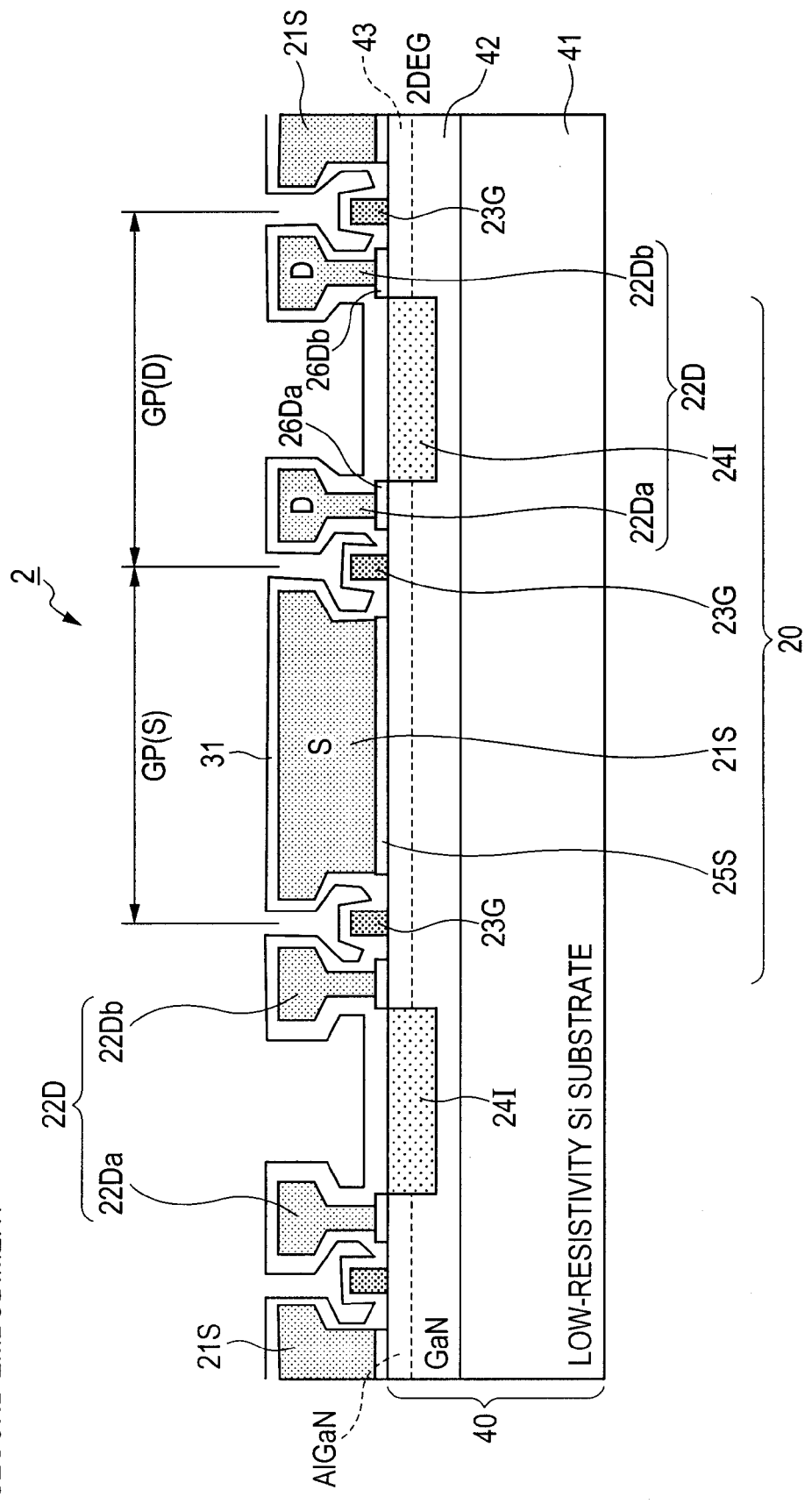
FIG. 5 is a schematic sectional view of a semiconductor device with a FET according to a second embodiment of the invention.

Next, the structure of a semiconductor device 2 according to a second embodiment of the present invention will be described referring to the accompanying drawings. FIG. 5 is a schematic sectional view of the semiconductor device with an FET according to the second embodiment. For easy understanding, the scales and positions of the elements shown in the figures are different from their actual scales and positions. The same elements as in the first embodiment are designated by the same reference numerals and their descriptions are omitted.

As shown in FIG. 5, the semiconductor device 2 according to the second embodiment is structured as follows: a plurality of FETs 20, each FET having a source electrode 21S, a drain electrode 22D, and a gate electrode 23G, are formed on a GaN epitaxial wafer 40 in which a GaN epitaxial layer 42 has grown on a low-resistivity Si substrate 41 with a resistivity of $1.0 \times 10^{-1}$ Ωcm or less and an AlGaN layer 43 has grown on it.

In this embodiment, the Si substrate 41 is of p type and doped with $2.0 \times 10^{19}$ cm$^{-3}$ of boron B and has a resistivity of $2.0 \times 10^{-2}$ Ωcm at room temperature.

The semiconductor device according to this embodiment is structurally the same as the first embodiment except the substrate.

In this embodiment as well, the drain electrode 22D is divided into two drain sub-electrodes 22Da and 22Db and an insulating region 24I is formed between the drain ohmic contacts 26Da and 26Db formed under the drain sub-electrodes 22Da and 22Db respectively.

The number of sub-electrodes into which the drain electrode 22D is divided is not limited to 2 but may be 3 or more.

As indicated in FIG. 8 which shows the temperature dependence of the resistivity of Si, the resistivity of Si having a high resistivity at room temperature is more temperature-dependent while the resistivity of Si having a low resistivity at room temperature is less temperature-dependent even at high temperatures. Therefore, the temperature change of the parasitic capacitance of the GaN-FET on a low-resistivity Si substrate can be improved in the range from room temperature to high temperatures.

Figure 6:
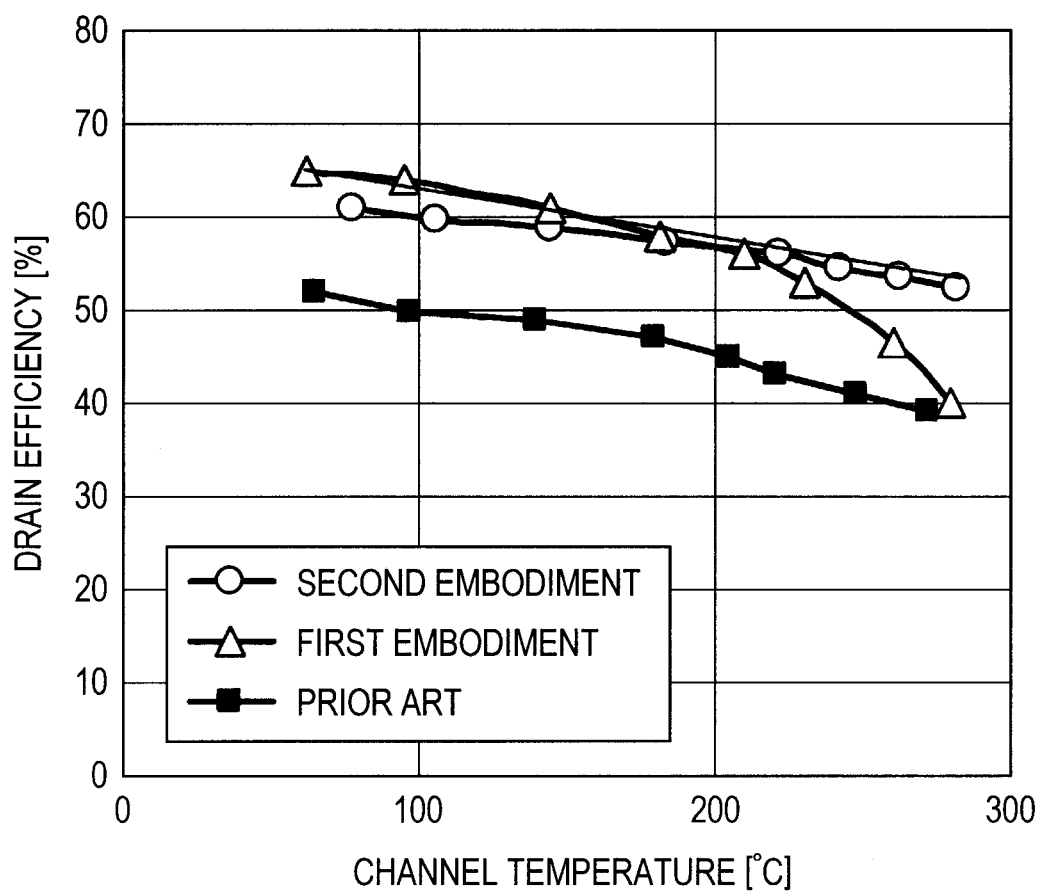
FIG. 6 is a graph which shows drain efficiency versus temperature characteristics in the FETs according to the first and second embodiments and an example of prior art.
Figure 15:
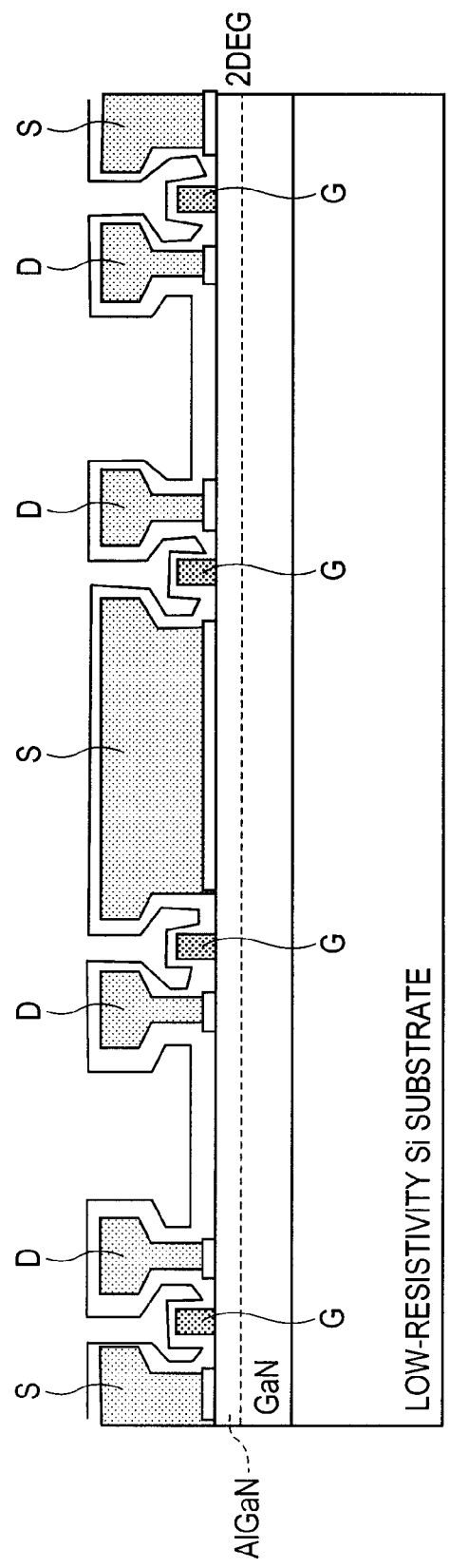
FIG. 15 is a schematic sectional view of a semiconductor device with a FET as comparative example 3.

FIG. 6 shows a comparison in drain efficiency versus temperature characteristics between the FET according to the second embodiment and the FET as comparative example 3 shown in FIG. 15, in which comparative example 3 has a drain electrode divided into sub-electrodes in the same way as in the second embodiment but does not have an insulating region between the drain ohmic contacts formed under the drain sub-electrodes. Here, gate width Wg is 2.4 mm and in RF measurement, the frequency is 2 GHz and the drain voltage is 50 V. Data on the first embodiment is also shown in FIG. 6.

When a low-resistivity substrate is used, the temperature dependence is reduced but in the case of the FET shown in FIG. 15 as comparative example 3, the overall efficiency is much lower in the low-to-high temperature range. This is because in the structure of comparative example 3, the parasitic capacitance is as high as 3.3 pF even at room temperature.

By contrast, in the structure according to the second embodiment, the parasitic capacitance at room temperature is as low as 2.0 pF and the decline in the efficiency is suppressed. As compared with the FET according to the first embodiment, which uses a high-resistivity substrate and has a parasitic capacitance of 1.3 pF at room temperature, the FET according to the second embodiment has a larger parasitic capacitance at room temperature and is thus slightly lower in efficiency at low temperatures. On the other hand, at 200° C. or more, while in the FET according to the first embodiment the parasitic capacitance increases and the efficiency significantly declines, the FET according to the second embodiment experiences no sharp decline in the efficiency and provides ideal efficiency versus temperature characteristics as a GaN-FET.

When the present invention is applied to a GaN-FET on a low-resistivity Si substrate, the temperature dependence of parasitic capacitance can be decreased and the decline in the efficiency can be reduced. According to the second embodiment, the GaN-FET on an inexpensive low-resistivity Si substrate can achieve as high efficiency as the GaN-FET on an expensive semi-insulating SiC substrate at high temperatures. Since a large diameter Si substrate is easily made, the cost to fabricate the GaN-FET would be reduced.

In the semiconductor device 2 according to the second embodiment as well, the gate pitch can be large enough to prevent the channel temperature between neighboring FETs 20 formed on a wafer 40 from going up.

In the semiconductor device 2 according to the second embodiment as well, the drain electrode 22D is divided into a plurality of drain sub-electrodes (22Da and 22Db) and the drain ohmic contacts formed under the drain sub-electrodes 22Da and 22Db are insulated from each other, so the drain area and the area of the conductive layer under it can be small, thereby decreasing the parasitic capacitance with the substrate effectively. Therefore, even when the gate pitch is increased in order to decrease the thermal resistance, the parasitic capacitance with the substrate is suppressed effectively because the drain electrode area and the area of the conductive layer under it are small.

In the second embodiment, since a low-resistivity substrate with a low temperature dependence of resistivity is employed, the temperature dependence of parasitic capacitance is lower than in the first embodiment so that high efficiency can be maintained at high temperatures.

According to the second embodiment as well, a GaN wafer which uses a low-cost Si substrate can be employed so that cost reduction can be achieved.

Design Variation

The present invention is not limited to the aforementioned embodiments and modifications thereto may be made as appropriate without departing from the spirit and scope of the invention.

Considering that the second embodiment employing a low-resistivity Si substrate produces an effect as expected, it can be thought that the use of a low-resistivity SiC substrate or composite substrate based on Semiconductor-ON-Insulator (SOI) technology (for example, GaN on low-resistivity poly SiC substrate) produces a similar effect. These substrates are more expensive than Si substrates but more inexpensive than semi-insulating SiC substrates, therefore, they are advantageous for the purpose of cost reduction compared to the GaN-FET on semi-insulating SiC substrate. In addition, a SiC substrate can have a high thermal conductivity even when it has a low resistivity, offering an advantage from the viewpoint of thermal design compared to GaN-FET on Si substrate.

What is claimed is:

1. A field-effect transistor disposed on a semiconductor layer, the field-effect transistor comprising:
   a source electrode;
   a source ohmic contact disposed under the source electrode and on the semiconductor layer;
   a drain electrode divided into a plurality of drain sub-electrodes spaced from each other;
   a plurality of drain ohmic contacts disposed under the drain sub-electrodes and on the semiconductor layer;
   a gate electrode located between the source electrode disposed on one side of the gate electrode and the drain electrode disposed on the other side of the gate electrode,
   wherein an insulating region is disposed between the drain ohmic contacts disposed under the drain sub-electrodes, the insulating region being disposed within the semiconductor layer.

2. The field-effect transistor according to claim 1, wherein the semiconductor layer is disposed on a high-resistivity Si substrate having a resistivity of $1.0 \times 10^2$ Ωcm or more at room temperature.

3. The field-effect transistor according to claim 1, wherein the semiconductor layer is disposed on a low-resistivity Si substrate having a resistivity of $1.0 \times 10^{-1}$ Ωcm or less at room temperature.

4. The field-effect transistor according to claim 1, wherein the semiconductor layer comprises a GaN layer, and the semiconductor layer is formed on a Si substrate.

5. The field-effect transistor according to claim 1, wherein the semiconductor layer comprises a GaN layer and an AlGaN layer, and the semiconductor layer is formed on a Si substrate.

6. The field-effect transistor according to claim 1, wherein the semiconductor layer comprises a layer structure of an AlGaN layer on a GaN layer, and the insulating region extends from an upper surface of the AlGaN layer to an upper side of the GaN layer.

7. A semiconductor device, comprising:
   a semiconductor layer;
   a field-effect transistor, comprising
      a source electrode,
      a source ohmic contact disposed under the source electrode and on the semiconductor layer,
      a drain electrode divided into a plurality of drain sub-electrodes spaced from each other,
      a plurality of drain ohmic contacts disposed under the drain sub-electrodes and on the semiconductor layer, and
      a gate electrode located between the source electrode disposed on one side of the gate electrode and the drain electrode disposed on the other side of the gate electrode; and
      an insulating region disposed only between the drain ohmic contacts formed under the drain sub-electrodes, the insulating region being disposed within the semiconductor layer.

8. The semiconductor device according to claim 7, wherein the semiconductor layer is disposed on a high-resistivity Si substrate having a resistivity of $1.0 \times 10^2$ Ωcm or more at room temperature.

9. The semiconductor device according to claim 7, wherein the semiconductor layer is disposed on a low-resistivity Si substrate having a resistivity of $1.0 \times 10^{-1}$ Ωcm or less at room temperature.

10. The semiconductor device according to claim 7, wherein the semiconductor layer comprises a GaN layer, and the semiconductor layer is formed on a Si substrate.

11. The semiconductor device according to claim 7, wherein the semiconductor layer comprises a GaN layer and an AlGaN layer, and the semiconductor layer is formed on a Si substrate.

12. The semiconductor device according to claim 7, wherein the semiconductor layer comprises a layer structure of an AlGaN layer on a GaN layer, and the insulating region extends from an upper surface of the AlGaN layer to an upper side of the GaN layer.

* * * * *